US006880461B2

(12) United States Patent
Hiller

(10) Patent No.: US 6,880,461 B2
(45) Date of Patent: Apr. 19, 2005

(54) METHOD FOR PRODUCING FLEXO PRINTING FORMS BY MEANS OF LASER-DIRECT ENGRAVING

(75) Inventor: Margit Hiller, Karlstadt (DE)

(73) Assignee: BASF Drucksysteme, Stuttgart (DE)

( * ) Notice: Subject to any disclaimer, the term of this patent is extended or adjusted under 35 U.S.C. 154(b) by 0 days.

(21) Appl. No.: 10/489,279

(22) PCT Filed: Jun. 16, 2003

(86) PCT No.: PCT/EP03/06330

§ 371 (c)(1),
(2), (4) Date: Mar. 11, 2004

(87) PCT Pub. No.: WO03/106172

PCT Pub. Date: Dec. 24, 2003

(65) Prior Publication Data

US 2004/0231540 A1 Nov. 25, 2004

(30) Foreign Application Priority Data

Jun. 18, 2002 (DE) .......................................... 102 27 188

(51) Int. Cl.[7] .......................... G03F 7/095; B41M 5/00; B41C 1/05

(52) U.S. Cl. ................................ 101/463.1; 430/271.1; 430/273.1; 430/286.1

(58) Field of Search ........................... 101/463.1, 401.1, 101/395; 430/271.1, 273.1, 281.1, 286.1, 302, 306, 278.1

(56) References Cited

U.S. PATENT DOCUMENTS

| | | | | | |
|---|---|---|---|---|---|
| 4,427,759 | A | | 1/1984 | Gruetzmacher et al. | |
| 5,055,377 | A | * | 10/1991 | Littmann et al. | 430/271.1 |
| 5,061,606 | A | | 10/1991 | Telser et al. | |
| 5,176,986 | A | | 1/1993 | Telser et al. | |
| 5,259,311 | A | | 11/1993 | McCaughey, Jr. | |
| 5,679,485 | A | * | 10/1997 | Suzuki et al. | 430/18 |
| 5,798,202 | A | | 8/1998 | Cushner et al. | |
| 5,894,799 | A | * | 4/1999 | Bart et al. | 101/376 |
| 5,919,604 | A | * | 7/1999 | Reimers | 430/283.1 |
| 6,284,431 | B1 | * | 9/2001 | Tanizaki et al. | 430/273.1 |
| 6,355,395 | B1 | * | 3/2002 | Zwez et al. | 430/271.1 |
| 6,627,385 | B1 | | 9/2003 | Hiller et al. | |
| 2001/0044076 | A1 | | 11/2001 | Hiller et al. | |
| 2002/0018958 | A1 | * | 2/2002 | Nishioka et al. | 430/260 |
| 2002/0115019 | A1 | * | 8/2002 | Kaczun et al. | 430/273.1 |
| 2002/0123003 | A1 | | 9/2002 | Kannurpatti et al. | |
| 2003/0136285 | A1 | * | 7/2003 | Telser et al. | 101/463.1 |
| 2004/0089180 | A1 | * | 5/2004 | Hiller et al. | 101/463.1 |

OTHER PUBLICATIONS

Ullmann's enc., 6th ed, 2000, "Imaging Techn.", chapter 3.4.1.2.

WO 03/014831—A2, BASF Druckersysteme GmbH, 2003–312706/30, BADI Aug. 3, 2001.

* cited by examiner

*Primary Examiner*—Eugene H. Eickholt
(74) *Attorney, Agent, or Firm*—Novak Druce L Quigg, LLP

(57) ABSTRACT

Flexographic printing plates are produced by means of direct laser engraving by a process in which the starting material used is a flexographic printing element which has a relief-forming layer comprising a combination of a styrene/butadiene block copolymer and 20–40% by weight of a plasticizer. Flexographic printing plates obtainable by this process are used for flexographic printing with water-based or alcohol-based printing inks.

11 Claims, 2 Drawing Sheets

METHOD FOR PRODUCING FLEXO PRINTING FORMS BY MEANS OF LASER-DIRECT ENGRAVING

The present invention relates to a process for the production of flexographic printing plates by means of direct laser engraving, in which the starting material used is a flexographic printing element which has a relief layer comprising a combination of a styrene/butadiene block copolymer and 20–40% by weight of a plasticizer. The present invention furthermore relates to flexographic printing plates obtainable by this process and the use of flexographic printing plates for flexographic printing with water-based or alcohol-based printing inks.

Lasers are now used both in the area of offset printing plates and in the area of relief printing plates for various steps of the production process.

For example, it is known that the photosensitive layers of offset printing plates can be inscribed imagewise by means of suitable laser exposure units. The photosensitive layer is chemically modified, for example crosslinked, by the laser. The finished offset printing plate is obtained from the image-bearing crude product by means of a suitable development process (cf. for example Imaging Technology, Section 3.4.1.2., Ullmann's Encyclopedia of Industrial Chemistry, $6^{th}$ Edt., 2000 Electronic release). The thickness of said photosensitive layers of offset printing plates is usually from 0.3 to 5 $\mu$m.

It is furthermore known that images can be produced from flexographic printing plates with the use of IR-ablative masks, as disclosed, for example, in EP-A 654 150, instead of photographically produced masks. Here, a thin IR-sensitive, opaque layer is applied to the photopolymerizable layer. The thickness of such IR-ablative layers is usually just a few $\mu$m. The IR-ablative layer is inscribed imagewise using an IR laser, i.e. the parts in which the laser beam is incident on it are removed. The actual printing relief is produced in the conventional manner: exposure is effected to actinic light through the mask produced, and the relief layer is thus selectively crosslinked. Development is then effected with a washout agent in a conventional manner, both photosensitive material from the unexposed parts of the relief-forming layer and the residues of the IR-ablative layer being removed. Since the IR-ablative mask layer is of no importance for the actual printing process, the materials therefor can be sought exclusively with regard to the optimum use as a mask.

In direct laser engraving for the production of flexographic printing plates, on the other hand, a printing relief is engraved directly into the relief layer of a flexographic printing element by means of a laser. A subsequent development step, as in the conventional process or in the mask process, is no longer required. Typical relief layer thicknesses of flexographic printing plates are from 0.5 to 7 mm and may also be 0.2 mm in the case of special thin-film plates. The nonprinting wells in the relief are at least 0.03 mm in the screen area and substantially more in the case of other negative elements and may assume values up to 3 mm in the case of thick plates. Thus, large amounts of material have to be removed by means of the laser.

EP-A 640 043 and EP-A 640 044 disclose one-layer or multilayer elastomeric laser-engravable flexographic printing elements for the production of flexographic printing plates by means of laser engraving. The elements consist of reinforced elastomeric layers. Elastomeric binders are used for the production of the layer. The mechanical strength of the layer is increased by the reinforcement, in order to permit flexographic printing. The reinforcement is achieved either by introduction of suitable fillers, photochemical or thermochemical crosslinking or combinations thereof.

U.S. Pat. No. 5,259,311 discloses a process in which a commercial flexographic printing element is photochemically crosslinked by uniform exposure to UV/A in a first step, the release layer is then removed using a flexographic washout agent and a printing relief is engraved by means of a laser in a second step. A cleaning step is then carried out by means of a flexographic washout agent, followed by final drying of the plate.

Although the engraving of rubber impression cylinders by means of lasers has in principle been known since the 60s of the last century and the patents cited have also been filed 10 years ago, laser engraving has acquired broader commercial interest only in recent years with the advent of improved laser systems. The improvements in the laser systems include better focusability of the laser beam, higher power and computer-controlled beam modulation.

With the introduction of new, more efficient laser systems, however, the question of particularly suitable materials for laser-engravable flexographic printing plates is becoming increasingly important. Problems which played no role at all in the past because the laser systems did not at all allow the engraving of very fine structures are now important and lead to new requirements with respect to the material.

The relief layers of flexographic printing plates are of course soft and have relatively low melting or softening points. In laser engraving, they therefore have a strong tendency to form melt edges around the engraved elements. At the edge of the engraved elements, the layer melts under the influence of the laser beam but is not, or not completely, decomposed. Such melt edges cannot be removed or at least cannot be completely removed even by subsequent washing and lead to a blurred print. Undesired melting of the layer furthermore results in reduced resolution of the print motif in comparison with the digital data record.

EP-A 1 136 254 proposes the use of relief layers comprising polyoxyalkylene/polyethylene glycol graft copolymers as binders for solving this problem. However, since these copolymers are water-soluble, such relief printing plates have the disadvantage that they can be used only to a limited extent. The relief layer swells to an excessive extent in water-based flexographic printing inks, so that undesired effects, for example an intolerable increase in tonal value, occur during printing. Such printing plates can therefore be used substantially only for printing with UV inks. There is an urgent need to provide laser-engravable relief printing elements which are also suitable for printing with water-based inks and nevertheless can be engraved with lasers without undesired melting of the layer.

Furthermore, the degradation products which form in the course of the laser engraving frequently give rise to problems. In addition to gaseous fractions, aerosols are also produced. These are as a rule extremely tacky and may be wholly or partly deposited again on the surface of the printing relief and, in unfavorable cases, can even react again with the surface. This leads to unclean surfaces and hence also to poor printing behavior.

For solving this problem, U.S. Pat. No. 5,259,311 proposes subsequently cleaning the surface of the relief printing plate after the laser engraving with the aid of an organic solvent. However, the tacky decomposition products have substantially the same solubility behavior as the relief layer. For relief layers comprising hydrophobic polymers, an organic solvent therefore also has to be used for removing the decomposition products. The crosslinked relief-forming layer is no longer soluble therein but may well still be swellable. After such a subsequent washing step, the layer therefore has to be dried again in a further process step. The time and handling advantage achieved by laser engraving in the process is eliminated again since the drying process takes the most time in the course of processing. Decomposition products which have reacted again with the surface can no longer be removed at all and are consequently also detectable in the print. It will be extremely desirable to be able to have a flexographic printing element in which possible deposits can be removed simply with water or aqueous cleaning agents without the plate swelling thereby.

Very rapid engraving is furthermore required for the economical production of flexographic printing plates by means of laser engraving. The speed of the engraving depends on the one hand on the laser system chosen. On the other hand, the sensitivity of the relief-forming layer to the laser radiation chosen in each case should be very high. With regard to the sensitivity, however, it should be taken into account that the relief layer of the flexographic printing plate imparts both the elastomeric properties and the typical printing properties. Measures for improving the sensitivity therefore must not impair said properties.

It is an object of the present invention to provide a process for the production of flexographic printing plates by means of direct laser engraving, in which the occurrence of melt edges is substantially reduced, a very small amount of aerosols forms and possible deposits of decomposition products can be removed by simple treatment of the plate with water or aqueous cleaning agents and which process permits very rapid engraving with high resolution and in which the flexographic printing plates obtained are moreover suitable for printing with water-based flexographic printing inks.

We have found that this object is achieved by a process for the production of flexographic printing plates by means of laser engraving, in which the starting material used is a crosslinkable, laser-engravable flexographic printing element which at least comprises, arranged one on top of the other, a dimensionally stable substrate, at least one crosslinkable, laser-engravable relief layer having a thickness of at least 0.2 mm, at least comprising an elastomeric binder, a plasticizer and crosslinkable components which process comprises at least the following steps:

(a) uniform crosslinking of the relief-forming layer and (b) engraving of a printing relief into the crosslinked relief-forming layer with the aid of a laser, the height of the relief elements engraved with the laser being at least 0.03 mm, the binder being a styrene/butadiene block copolymer having an average molecular weight $M_w$ of from 100 000 to 250 000 g/mol, a Shore A hardness of from 55 to 85 and a styrene content of 20–40% by weight, based on the binder, and the amount of the plasticizer being from more than 20 to 40% by weight, based on the sum of all components of the layer.

Flexographic printing plates which are obtainable by the process described and the use of these flexographic printing plates for flexographic printing with water-based and/or alcohol-based printing inks have furthermore been found.

Surprisingly, it has been found that flexographic printing elements which have excellent sensitivity to lasers are obtained by the novel combination of styrene/butadiene block copolymers with from 20 to 40% by weight of plasticizers. The relief-forming layer scarcely melts under the influence of the laser radiation, and scarcely any melt edges form around the negative elements. The flexographic printing plates obtained also permit printing with water-based and/or alcohol-based inks without the relief layer swelling excessively with these inks.

Regarding the present invention, the following may be stated specifically:

Examples of suitable dimensionally stable substrates for the flexographic printing elements used as starting materials for the process are plates, sheets and conical and cylindrical sleeves of metals, such as steel, aluminum, copper or nickel, or of plastics, such as polyethylene terephthalate (PET), polyethylene naphthalate (PEN), polybutylene terephthalate, polyamide, polycarbonate, if required also woven fabrics and nonwovens, such as glass fiber fabrics, and composite materials, for example of glass fibers and plastics. Particularly suitable dimensionally stable substrates are dimensionally stable substrate sheets, for example polyester sheets, in particular PET or PEN sheets, or flexible metallic substrates, such as thin metal sheets or metal foils of steel, preferably of stainless steel, magnetizable spring steel, aluminum, zinc, magnesium, nickel, chromium or copper.

The flexographic printing element furthermore comprises at least one laser-engravable, crosslinkable relief-forming layer. The crosslinkable relief layer may be applied directly on the substrate. However, other layers, for example adhesion-promoting layers and/or resilient lower layers, may also be present between the substrate and the relief layer.

The crosslinkable relief-forming layer comprises at least one elastomeric binder, crosslinkable components and from 20 to 40% by weight of a plasticizer. As a rule, the crosslinkable relief layer as a whole already has elastomeric properties; for the present invention, however, it is sufficient if the crosslinked relief layer first has the elastomeric properties typical of a flexographic printing plate.

According to the invention, the elastomeric binder is a styrene/butadiene block copolymer. It may be a two-block copolymer, three-block copolymer or multiblock copolymer in which in each case a plurality of styrene and butadiene blocks follow one another alternately. It may be a linear, branched or star block copolymer. Preferably, the block copolymers used according to the invention are styrene/butadiene/styrene three-block copolymers. Such SBS block copolymers are commercially available, for example under the name Kraton®, it being necessary to take into account the fact that commercial three-block copolymers usually have a certain content of two-block copolymers. Of course, mixtures of different SBS block copolymers can also be used.

The elastomeric styrene/butadiene block copolymers used according to the invention in the starting material have an average molecular weight $M_w$ (weight average) of from 100 000 to 250 000 g/mol. $M_w$ is preferably from 150 000 to 250 000, very particularly preferably from 150 000 to 200 000, g/mol.

The styrene content of the styrene/butadiene block copolymers used is from 20 to 40, preferably from 25 to 35, % by weight, based on the binder.

The Shore A hardness of the binder is determined by the method of ISO 868. According to the invention, the elastomeric styrene/butadiene block copolymer used has a hardness of from 55 to 85 Shore A. The hardness of the binder is particularly preferably from 60 to 80, very particularly preferably from 65 to 75, Shore A.

In addition to the at least one styrene/butadiene block copolymer, the relief layer can optionally also have one or more secondary binders. Such secondary binders can be used by a person skilled in the art for fine control of the properties of the relief layer. The choice of secondary binders is in principle not limited, provided that the properties of the relief layer are not adversely affected thereby. Secondary binders are preferably styrene/butadiene block copolymers which do not only meet the abovementioned requirements with regard to molecular weight, hardness and styrene content. However, there may of course also be polymers of a chemically different type. The amount of secondary binder should as a rule not exceed 20, preferably 10, % by weight, based on the total amount of all binders used. If the secondary binder is a styrene/butadiene block copolymer, up to about 30% by weight, in special cases also up to about 40% by weight, based on the total amount of all binders used, may be employed.

The total amount of binders, i.e. styrene/butadiene block copolymers and any secondary binders present together, is usually from 40 to 80, preferably from 40 to 70, particularly preferably from 45 to 65, % by weight, based on the sum of all components of the relief-forming layer.

For the novel process, the binder is used as a mixture with at least one plasticizer. The amount of plasticizer is from 20 to 40, preferably from 25 to 40, particularly preferably from 30 to 40, % by weight, based on all components of the relief-forming layer.

The person skilled in the art chooses suitable plasticizers according to the desired properties of the relief layer. Examples of suitable plasticizers include modified and unmodified natural oils and natural resins, such as high-boiling paraffinic, naphthenic or aromatic mineral oils, synthetic oligomers or resins, such as oligostyrene, oligomeric styrene/butadiene copolymers, oligomeric $\alpha$-methylstyrene/p-methylstyrene copolymers, liquid oligobutadienes, in particular those having a molecular weight of from 500 to 5 000 g/mol, or liquid oligomeric acrylonitrile/butadiene copolymers or oligomeric ethylene/propylene/diene rubbers.

Inert plasticizers are particularly suitable for the novel process. Inert in the context of this invention means that the plasticizers have no or only substantially no polymerizable groups which can react in the course of free radical crosslinking of the relief-forming layer so that the plasticizers are also incorporated into the polymeric network of the relief layer. Inert plasticizers have in particular substantially no ethylenically unsaturated double bonds.

Examples of inert plasticizers include high-boiling paraffinic, naphthenic and aromatic mineral oils. Paraffinic and/or naphthenic mineral oils are substantially preferred. Such mineral oils can also be referred to as white oils, a person skilled in the art making a distinction between technical-grade white oils, which may still have a low content of aromatics, and medicinal white oils, which are substantially free of aromatics.

It is of course also possible to use mixtures of different plasticizers, provided that the properties of the relief layer are not adversely affected thereby. Preferred mixtures are those which comprise at least one inert plasticizer. An example is a mixture of liquid oligobutadienes and white oil.

The type and amount of the components for the crosslinking of the layer depend on the desired crosslinking technique and are chosen accordingly by a person skilled in the art. The uniform crosslinking of the crosslinkable relief layer is preferably carried out photochemically, thermochemically or by means of electron beams.

In the case of the photochemical crosslinking, the relief layer comprises at least one photoinitiator or a photoinitiator system and suitable monomers or oligomers.

Benzoin and benzoin derivatives, such as $\alpha$-methylbenzoin and benzoin ethers, benzil derivatives, such as benzil ketals, acylarylphosphine oxides, acylarylphosphinic esters and polynuclear quinones are suitable in a known manner as initiators for the photopolymerization, there being no intention to restrict the list to these.

The monomers have at least one polymerizable, olefinically unsaturated group. Esters or amides of acrylic acid or methacrylic acid with mono- or polyfunctional alcohols, amines, aminoalcohols or hydroxyethers and hydroxyesters, styrene or substituted styrenes, esters of fumaric or maleic acid or allyl compounds have proven particularly advantageous. Examples of suitable monomers include butyl acrylate, 2-ethylhexyl acrylate, lauryl acrylate, 1,4-butanediol diacrylate, 1,6-hexanediol diacrylate, 1,6-hexanediol dimethacrylate, 1,9-nonanediol diacrylate, trimethylolpropane triacrylate, dioctyl fumarate and N-dodecylmaleimide. Suitable oligomers having olefinic groups may also be used. It is of course also possible to use mixtures of different monomers or oligomers, provided that no undesired effects occur. The total amount of the monomers is established by a person skilled in the art according to the desired properties of the relief layer. As a rule, however, 20% by weight, based on the amount of all components of the laser-engravable relief-forming layer, should not be exceeded.

Thermal crosslinking is preferably carried out analogously to the photochemical crosslinking, by using a thermal polymerization initiator instead of a photoinitiator. Commercial thermal initiators for free radical polymerization, for example peroxides, hydroperoxides or azo compounds, are in principle suitable. The thermal crosslinking may also be carried out by adding a heat-curable resin, for example an epoxy resin, as a crosslinking component to the layer.

Crosslinking by means of electron beams is preferably carried out analogously to the photochemical crosslinking, by using photochemically crosslinkable relief layers described above and replacing the UV radiation with electron beams. The addition of initiators is not absolutely essential.

The crosslinkable relief layer can optionally furthermore comprise an absorber for laser radiation. Mixtures of different absorbers for laser irradiation may also be used. Suitable absorbers for laser radiation have a high absorption in the region of the laser wavelength. Particularly suitable absorbers are those which have a high absorption in the near infrared and in the longer-wave VIS range of the electromagnetic spectrum. Such absorbers are particularly suitable for the absorption of the radiation of Nd-YAG lasers (1 064 nm) and of IR diode lasers, which typically have wavelengths of from 700 to 900 nm and from 1 200 to 1 600 nm.

Examples of suitable absorbers for laser radiation are dyes which absorb strongly in the infrared spectral range, for example phthalocyanines, naphthalocyanines, cyanines, quinones, metal complex dyes, such as dithiolenes, or photochromic dyes. Further suitable absorbers are inorganic pigments, in particular intensely colored inorganic pigments, for example chromium oxides, iron oxides, carbon black or metallic particles.

Particularly suitable absorbers for laser radiation are finely divided carbon black grades having a primary particle size of from 10 to 50 nm.

The amount of the optionally added absorber is chosen by a person skilled in the art according to the respective desired properties of the laser-engravable flexographic printing element. In this context, a person skilled in the art will take into account the fact that the added absorber influences not only the engraving of the elastomeric layer by laser but also the properties of the relief printing plate obtained as the end product of the process, for example its hardness, resilience, thermal conductivity or ink transfer behavior. As a rule, it is therefore advisable to use not more than 20% by weight at most, preferably not more than 10% by weight, based on the sum of all components of the layer, of absorber for laser radiation.

As a rule, it is not advisable to add to relief layers which are to be photochemically crosslinked absorbers for laser radiation which also absorb in the UV range, since the photopolymerization is at least greatly impaired thereby and may be rendered completely impossible. It is advisable as a rule to subject such layers containing laser absorbers to thermal crosslinking or crosslinking by means of electron beams.

The relief-forming layers furthermore comprise additives and assistants, for example dyes, dispersants or antistatic agents. However, the amount of such additives should as a rule not exceed 5% by weight, based on the amount of all components of the crosslinkable, laser-engravable layer of the recording element.

The crosslinkable relief-forming layer may also be composed of a plurality of part-layers. These crosslinkable part-layers may be of the same, roughly the same or different material composition.

The thickness of the laser-engravable, elastomeric layer is at least 0.2, preferably from 0.3 to 7, particularly preferably from 0.5 to 5, very particularly preferably from 0.7 to 4, mm. The thickness is suitably chosen by a person skilled in the art according to the desired use of the flexographic printing plate.

In a preferred embodiment, the starting material comprises an additional laser-engravable polymer layer which is soluble or at least swellable in aqueous media and is arranged on the laser-engravable relief-forming layer, and which comprises at least one polymer soluble, swellable or dispersible in aqueous solvents. Such a layer serves for facilitating a subsequent cleaning step optionally to be carried out. Solid decomposition products formed in the course of the laser engraving may be deposited on this auxiliary layer and can be more easily removed.

Examples of the polymer soluble or at least swellable in aqueous solvents include polyvinyl alcohol, polyvinyl alcohol/polyethylene glycol graft copolymers, polyvinylpyrrolidone and its derivatives and cellulose derivatives, in particular cellulose esters and cellulose ethers, such as methylcellulose, ethylcellulose, benzylcellulose, hydroxyalkylcelluloses or nitrocelluloses. Mixtures of a plurality of polymers can of course also be used.

The additional laser-engravable polymer layer may also contain additives and assistants, for example plasticizers or laser absorbers. If it is intended to crosslink the laser-engravable relief layer photochemically, the additional polymer layer should as far as possible be transparent in the UV range. In the case of other crosslinking methods, this is not absolutely essential.

The thickness of the additional polymer layer should be very small. It depends substantially on the depth of focus of the laser used for engraving in the process. It is limited so that there is no substantial broadening of the focus on the surface of the relief layer.

The thickness of such an additional polymer layer should as a rule not exceed 100 $\mu$m. As a rule, satisfactory results are no longer achieved in the case of greater thicknesses. The thickness should preferably not exceed 50 $\mu$m. The thickness is particularly preferably 1–40 $\mu$m, very particularly preferably 2–25 $\mu$m.

The laser-engravable flexographic printing element can optionally also comprise further layers.

Examples of such layers include elastomeric lower layers comprising a different formulation, which is present between the substrate and the laser-engravable layer or layers and which need not necessarily be laser-engravable. The mechanical properties of the relief printing plates can be modified by means of such lower layers without the properties of the actual printing relief layer being influenced.

Resilient substructures which are present under the dimensionally stable substrate of the laser-engravable flexographic printing element, i.e. on that side of the substrate which faces away from the laser-engravable relief layer, serve the same purpose.

Further examples include adhesion-promoting layers which bond the substrate to layers located above or bond different layers to one another.

Furthermore, the laser-engravable flexographic printing element can be protected from mechanical damage by a protective sheet—also known as covering sheet—which consists, for example, of PET and is present on the respective uppermost layer and which has to be removed before engraving by means of lasers. To facilitate peeling off, the protective sheet may have been surface-treated in a suitable manner, for example by siliconizing, provided that the top relief layer is not adversely affected in its printing properties by the surface treatment.

The flexographic printing element used as a starting material for the process can be produced, for example, by dissolving or dispersing all components in a suitable solvent and casting on a substrate. In the case of multilayer elements, a plurality of layers can be cast one on top of the other in a manner known in principle. After the casting, the cover sheet can, if desired, be applied for protecting the starting material from damage. Conversely, it is also possible to cast onto the cover sheet and finally to laminate with the substrate. The casting method is particularly advisable if thermal crosslinking is intended.

If photochemical or electron beam crosslinking is intended, the production of the relief layer is preferably carried out in a manner known in principle by melt extrusion between a substrate sheet and a cover sheet or a cover element and calendering of the composite obtained, as disclosed, for example, in EP-A 084 851. In this way, it is also possible to produce thick layers in a single operation. Multilayer elements can be produced, for example, by means of coextrusion. Flexographic printing elements having metallic substrates can preferably be obtained by casting or extruding onto a temporary substrate and then laminating the layer with the metallic substrate.

It has usually proven useful first to process the styrene/butadiene block copolymer with a part of the plasticizer in a suitable mixing unit to give a homogeneous material. The material obtained is then further processed in a second step in an extruder together with the other components of the layer and the remainder of the plasticizer. A larger amount of plasticizer can advantageously thus also be incorporated over a short extruder length and particularly homogeneous incorporation of the plasticizer can be achieved. Moreover, the residence times of the polymeric material in the hot zone of the extruder can be reduced.

The application of the additional polymer layer can be effected, for example, by dissolving the components in a suitable solvent and casting onto the relief-forming layer. Preferably, however, the cover sheet is coated with the additional polymer layer and laminated with the relief-forming layer or used as a sheet for the extrusion process.

In the novel process, the starting material is first uniformly crosslinked in the first process step (a).

The uniform crosslinking of the crosslinkable relief layer can be carried out photochemically, in particular by exposure to UV-A radiation having a wavelength of from 320 to 400 nm or UV-A/VIS radiation having a wavelength of from about 320 to about 700 nm. Uniform thermochemical crosslinking is effected by very uniform heating of the relief layer at constant temperature. Furthermore, crosslinking can be effected by uniform exposure to electron beams. The radiation dose required for crosslinking can particularly advantageously be divided into a plurality of part-doses.

The photochemical crosslinking is particularly suitable for relief layers which contain no strongly colored absorbers for laser radiation and are transparent or at least substantially transparent in the UV/VIS range. However, transparent relief layers can of course also be crosslinked thermochemically or by means of electron beams. Relief layers containing colored laser absorbers can advantageously be crosslinked thermochemically or by means of electron beams.

Of course, the flexographic printing element used as a starting material for the process is usually produced by a printing plate manufacturer whereas the laser engraving is carried out by process engravers or printing works. The uniform crosslinking (a) can on the one hand be carried out by the process engravers themselves. For example, the photochemical crosslinking can be carried out in commercial exposure units for flexographic printing plates. On the other hand, the crosslinking can of course also be effected by the manufacturer of flexographic printing elements or on his premises.

In process step (b), a printing relief is engraved into the crosslinked relief layer by means of a laser. If a protective sheet is present, this is removed prior to engraving.

The term laser-engravable is to be understood as meaning that the relief layer has the property of absorbing laser radiation, in particular the radiation of an IR laser, so that it is removed or at least detached in those parts where it is exposed to a laser beam of sufficient intensity. The layer is preferably vaporized or thermally or oxidatively decomposed without melting beforehand, so that its decomposition products are removed from the layer in the form of hot gases, vapors, fumes or small particles.

IR lasers are particularly suitable for engraving. For example, a $CO_2$ laser having a wavelength of 10.6 $\mu$m may be used. Furthermore, Nd-YAG lasers (1 064 nm), IR diode lasers or solid-state lasers may be used. It is also possible to use lasers having shorter wavelengths, provided that the laser has a sufficient intensity. For example, a frequency-doubled (532 nm) or frequency-tripled (355 nm) Nd-YAG laser or an excimer laser (e.g. 248 nm) may also be used.

The addition of absorbers for laser radiation depends substantially on the type of laser which is to be used for the engraving. The styrene/butadiene block copolymers used for the relief layer absorb the radiation of $CO_2$ lasers to a sufficient extent, so that additional IR absorbers in the relief layer are as a rule not required when this type of laser is used. The same applies to UV lasers, for example excimer lasers. In the case of Nd-YAG lasers and IR diode lasers, the addition of a laser absorber is generally necessary.

The image information to be engraved can be transferred directly from the layout computer system to the laser apparatus. The lasers can be operated either continuously or in pulsed mode.

Relief elements in which the sidewalls of the elements initially drop perpendicularly and broaden only in the lower region are advantageously engraved. A good shoulder shape of the relief dots together with little increase in tonal value is thus achieved. However, sidewalls of other designs can also be engraved.

The height of the elements to be engraved depends on the total thickness of the relief and on the type of elements to be engraved and is determined by a person skilled in the art according to the desired properties of the printing plate. The height of the relief elements to be engraved is at least 0.03 mm, preferably at least 0.05 mm, the minimum depth between individual dots being mentioned here. Printing plates having relief heights which are too small are as a rule unsuitable for printing by means of a flexographic printing technique, because the negative elements become full to overflowing with printing ink. Individual negative dots should usually have greater depths; for those of 0.2 mm diameter, a depth of at least from 0.07 to 0.08 mm is usually advisable. In the case of surfaces which have been removed by engraving, a depth of more than 0.15 mm, preferably more than 0.4 mm, is advisable. The latter is of course possible only in the case of an appropriately thick relief.

Advantageously, the flexographic printing plate obtained is cleaned in a further process step (c) after the laser engraving. In some cases, this can be effected by simply blowing off with compressed air or brushing off.

In a preferred embodiment, a liquid cleaning agent is used for the subsequent cleaning, in order also to be able to remove polymer fragments completely. This is particularly advisable, for example, when food packaging which has to meet particularly stringent requirements with respect to volatile components is to be printed using the flexographic printing plate.

The subsequent cleaning can be very particularly advantageously effected by means of water or an aqueous cleaning agent. Aqueous cleaning agents substantially comprise water and optionally small amounts of alcohols and may contain assistants, for example surfactants, emulsifiers, dispersants or bases, for promoting the cleaning process. It is also possible to use mixtures which are usually used for developing conventional, water-developable flexographic printing plates. Since the relief layer comprising styrene/butadiene block copolymers is not swellable in water, time-consuming drying of the printing plate is avoided by the use of water or aqueous cleaning agents.

The subsequent cleaning can be effected, for example, by simple immersion or spraying of the relief printing plate or can additionally be promoted by mechanical means, for example by brushing or treatment with a plush pad. It is also possible to use conventional flexographic plate washers.

In the subsequent washing step, any deposits and the residues of the additional polymer layer are removed. This layer advantageously prevents polymer droplets formed in the course of the laser engraving from becoming firmly bonded again to the surface of the relief layer, or at least makes it more difficult for this to occur. Deposits can therefore be particularly readily removed. It is as a rule advisable to carry out the subsequent washing step immediately after the laser engraving step.

Although not the preferred variant, it is also possible in principle to use mixtures of organic solvents for the subsequent cleaning, in particular those mixtures which usually serve as washout agents for conventionally produced flexographic printing plates. Examples include washout agents based on high-boiling, dearomatized mineral oil fractions, as disclosed, for example, in EP-A 332 070, or water-in-oil emulsions, as disclosed in EP-A 463 016. This variant can be used in particular when no additional polymer layer is present. If an additional polymer layer is present but cannot be removed with the organic solvent used, cleaning must additionally be effected with water or an aqueous cleaning agent.

The flexographic printing plates obtained are particularly suitable for printing with water-based inks and alcohol-based inks. However, they are of course also suitable for printing with UV inks or flexographic printing inks which contain small amounts of esters.

The examples which follow illustrate the invention:

EXAMPLE 1

A photochemically crosslinkable laser-engravable relief-forming layer was produced using the following starting materials

| Component | Description | Amount [% by wt.] |
|---|---|---|
| Styrene/butadiene block copolymer | SBS block copolymer, $M_w$ 125 000 g/mol, 29.5% styrene content, 70° Shore A (Kraton D-1102) | 55% |
| Plasticizer | Polybutadiene oil | 32% |
| Components for crosslinking | Monomer: Hexanediol diacrylate | 10% |
| | Photoinitiator | 2% |
| Additives | Dye, thermal stabilizer | 1% |

The components were processed using an extruder (ZSK 53) at 140° C., introduced by means of a slot die between a dimensionally stable PET substrate sheet and a PET protective sheet and then calendered by means of a two-roll calender. The thickness of the resulting crosslinkable, laser-engravable layer was 1.14 mm.

EXAMPLE 2

A photochemically crosslinkable laser-engravable relief-forming layer was produced using the following starting materials

| Component | Description | Amount [% by wt.] |
|---|---|---|
| Styrene/butadiene block copolymer | SBS block copolymer, $M_w$ 170 000 g/mol, 31% styrene content, 72° Shore A (Kraton D-1101) | 38% |
| Secondary binder | Styrene/butadiene two-block copolymer, $M_w$ 230 000 g/mol (Kraton DX-1000) | 10% |
| Plasticizers | Polybutadiene oil | 20% |
| | White oil | 18% |
| Components for crosslinking | Hexanediol diacrylate | 10% |
| | Photoinitiator | 2% |
| Additives | Dye, thermal stabilizer | 2% |

The components were processed as in example 1. The thickness of the resulting crosslinkable, laser-engravable layer was 1.14 mm.

EXAMPLE 3

The procedure was as in example 1, except that an additional polymer layer comprising a water-soluble polymer was also applied to the relief layer (polyvinyl alcohol, Alcotex 4-86, thickness: 3 μm). For this purpose, in a separate process step, the protective PET sheet mentioned at the outset was coated with a solution of Alcotex 4-86 in a water/alcohol mixture and the solvent mixture was evaporated. The coated PET sheet was used for the extrusion process described. The thickness of the resulting crosslinkable, laser-engravable layer was 1.14 mm.

COMPARATIVE EXAMPLE 1

A photochemically crosslinkable laser-engravable relief-forming layer was produced using the following starting materials

| Component | Description | Amount [% by wt.] |
|---|---|---|
| Elastomeric binder | SIS block copolymer, $M_w$ 210 000 g/mol, 17% styrene content, 31° Shore A (Kraton D-1161) | 48% |
| Plasticizer | White oil | 6% |
| Components for crosslinking | Hexanediol diacrylate, monoacrylate | 13% |
| | Photoinitiator | 2% |
| Additives | Dye, thermal stabilizer | 4% |

The components were processed as in example 1. The thickness of the resulting crosslinkable, laser-engravable layer was 1.14 mm.

Carrying Out the Novel Process:

The protective PET sheet was peeled off from the laser-engravable flexographic printing elements obtained in the examples and comparative examples. They were uniformly crosslinked by exposure to UVA light for 20 minutes in a first process step. In examples 1 and 2, additional crosslinking of the uppermost region of the relief layer was carried out using UVC light.

Laser Engraving of the Flexographic Printing Elements

A three-beam $CO_2$ laser (STK, Kufstein, type BDE 4131) was used for laser engraving experiments.

After the flexographic printing element had been clamped on a cylinder, a test motif consisting of various, typical, positive and negative elements was engraved into the flexographic printing element. In addition to surface areas completely removed by engraving and 100% tonal values, the motif also contained various screen areas having tonal values of from 1 to 98% and 40 μm wide negative lines in the axial and transverse directions relative to the axis of rotation of the cylinder. The speed of rotation of the cylinder was 7 m/s. The power setting of the beams was: 1st beam 40, 2nd and 3rd beams 90.

After the laser engraving, the flexographic printing plates obtained were washed for two minutes with water with simultaneous brushing of the surface. A nyloprint® washer (apparatus combination CW 22×30, BASF Drucksysteme GmbH) was used for this purpose.

The following features are determined for assessing the quality of the flexographic printing plates:

- The engraving depth T as a measure of the sensitivity, measured as a height difference between a part from which material has been uniformly removed and the plate surface.
- Visual assessment of the formation of deposits, melt edges and tacky droplets (deposits) and visual assessment of the possibility of washing away superficial deposits (washability) during subsequent washing with water.

The results are listed in table 1.

Furthermore, FIGS. 1 and 2 each show an image of the flexographic printing plate obtained according to comparative example 1 and according to example 1.

TABLE 1

| Example No. | Engraving depth T [$\mu$m] | Deposits (visually) | Washability (visually) |
|---|---|---|---|
| 1 | 410 | few | good |
| 2 | 430 | few | good |
| 3 | 410 | few | very good |
| C 1 | 300 | many | poor |

Both the results of the measurements and the figures clearly show that the novel process gives flexographic printing plates which have scarcely any melt edges and substantially fewer deposits than in the comparative example. The height of the engraved relief elements is substantially greater in the example than in the comparative example.

The flexographic printing plates obtained according to the invention are suitable for printing with alcohol-based and water-based inks.

Figure 1:
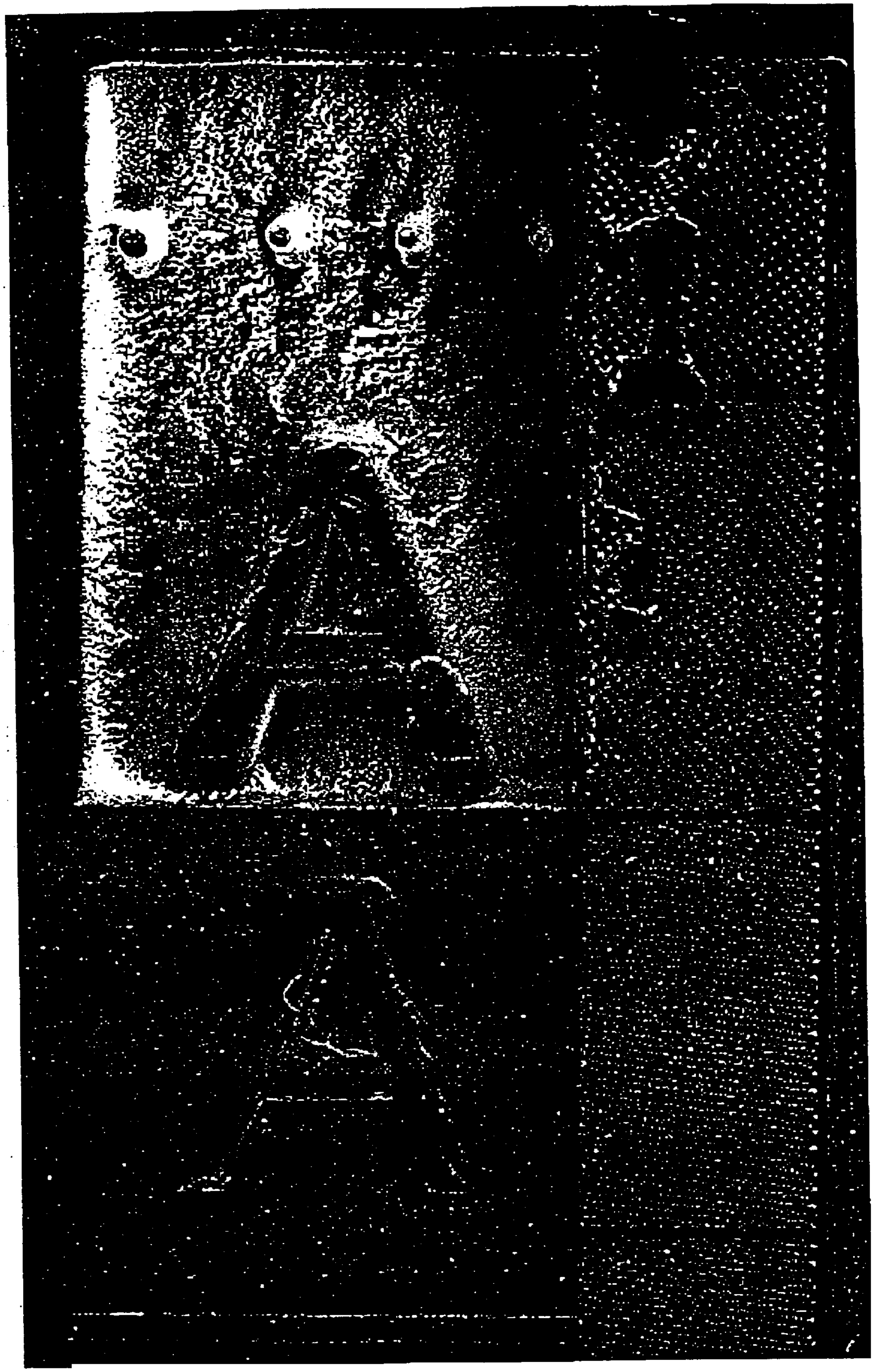
FIG. 1: Flexographic printing plate acc. to comp. ex. 1
Figure 2:
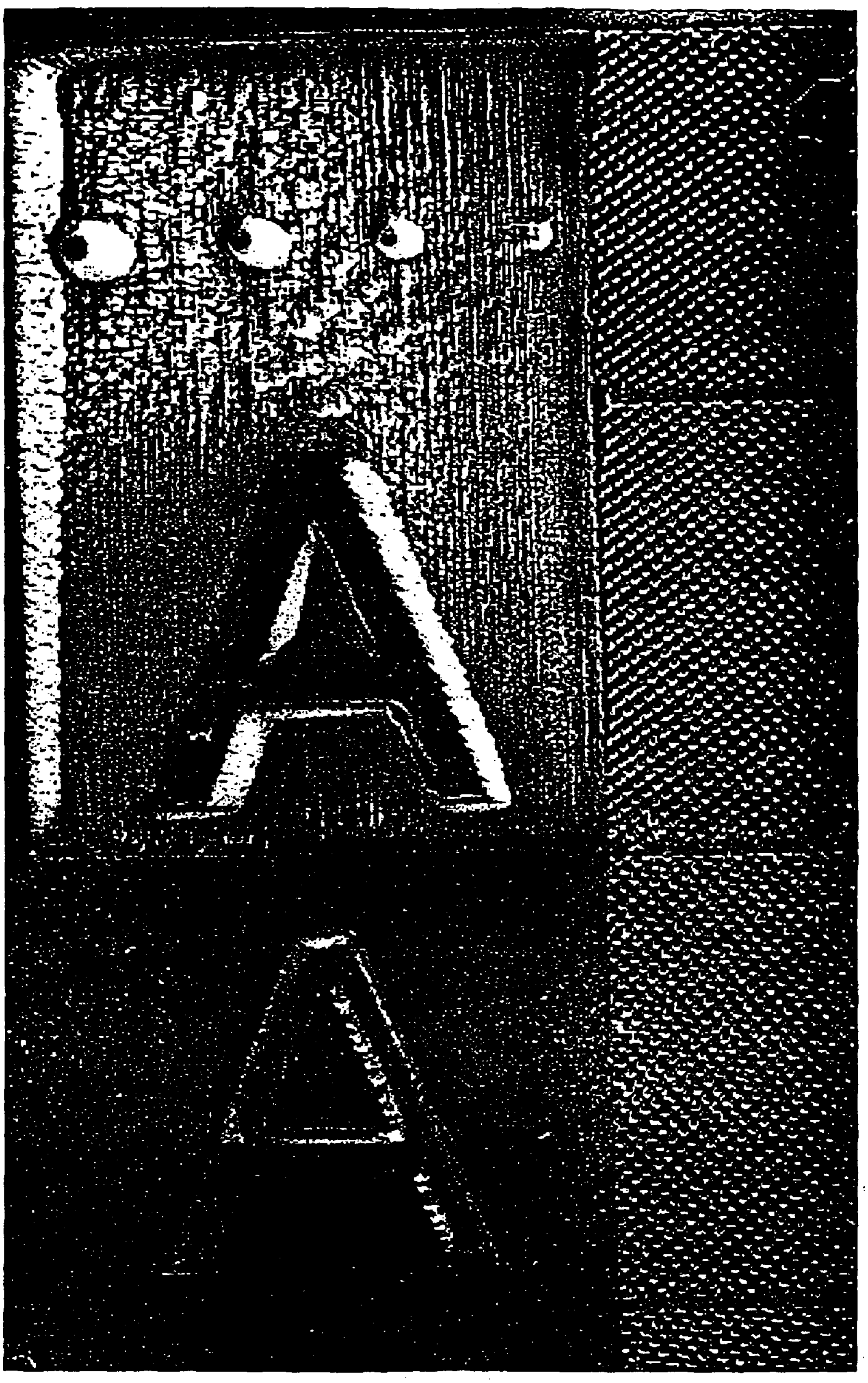
FIG. 2: Flexographic printing plate acc. to example 1

The "A" is 6 mm wide and 7 mm high in each case.

We claim:

1. A process for the production of flexographic printing plates by means of laser engraving, in which the starting material used is a crosslinkable, laser-engravable flexographic printing element which at least comprises, arranged one on top of the other, a dimensionally stable substrate, at least one crosslinkable, laser-engravable relief-forming layer having a thickness of at least 0.2 mm, at least comprising an elastomeric binder, a plasticizer and components for crosslinking, and which process comprises at least the following steps:

(a) uniform crosslinking of the relief-forming layer and (b) engraving of a print relief into the crosslinked relief layer with the aid of a laser, the height of the relief elements to be engraved with the laser being at least 0.03 mm, wherein the binder is a styrene/butadiene block copolymer having an average molecular weight $M_w$ of from 100 000 to 250 000 g/mol, a Shore A hardness of from 55 to 85 and a styrene content of 20–40% by weight, based on the binder, and the amount of the plasticizer is from 20 to 40% by weight, based on the sum of all components of the layer.

2. A process as claimed in claim 1, wherein the average molecular weight $M_w$ of the binder is from 150 000 to 250 000 g/mol.

3. A process as claimed in claim 1, wherein the styrene content of the binder is from 25 to 35% by weight.

4. A process as claimed in claim 1, wherein the plasticizer is an inert plasticizer.

5. A process as claimed in claim 4, wherein the inert plasticizer is at least one inert plasticizer selected from the group consisting of aromatic, naphthenic and paraffinic mineral oils.

6. A process as claimed in claim 1, wherein the uniform crosslinking (a) is carried out photochemically, by means of electron beams or thermally.

7. A process as claimed in claim 1, wherein the relief layer additionally comprises an absorber for laser radiation.

8. A process as claimed in claim 1, wherein the flexographic printing element comprises an additional, water-soluble laser-engravable layer which is arranged on the laser-engravable relief-forming layer and comprises at least one polymer soluble, swellable or dispersible in aqueous solvents and which is removed after process step (b) in a further process step (c) by means of water or an aqueous cleaning agent.

9. A process as claimed in claim 8, wherein the polymer is at least one polymer selected from the group consisting of polyvinyl alcohol, polyvinyl alcohol/polyethylene glycol graft copolymers, polyvinylpyrrolidone and cellulose derivatives.

10. A flexographic printing plate obtainable by a process as claimed in claim 1.

11. The use of a flexographic printing plate as claimed in claim 10 for flexographic printing with water-based and/or alcohol-based printing inks.

* * * * *